United States Patent
Watson

(10) Patent No.: US 10,371,727 B2
(45) Date of Patent: Aug. 6, 2019

(54) DYNAMIC SENSITIVITY ADJUSTMENT FOR ADC MEASUREMENTS

(71) Applicant: SCHNEIDER ELECTRIC IT CORPORATION, West Kingston, RI (US)

(72) Inventor: Steven M. Watson, Manchester, MO (US)

(73) Assignee: SCHNEIDER ELECTRIC IT CORPORATION, West Kingston, RI (US)

( * ) Notice: Subject to any disclaimer, the term of this patent is extended or adjusted under 35 U.S.C. 154(b) by 619 days.

(21) Appl. No.: 14/897,465

(22) PCT Filed: Jun. 12, 2013

(86) PCT No.: PCT/US2013/045380
§ 371 (c)(1),
(2) Date: Dec. 10, 2015

(87) PCT Pub. No.: WO2014/200473
PCT Pub. Date: Dec. 18, 2014

(65) Prior Publication Data
US 2016/0139185 A1    May 19, 2016

(51) Int. Cl.
*H02J 3/00* (2006.01)
*G01R 19/257* (2006.01)
(Continued)

(52) U.S. Cl.
CPC ........... *G01R 19/257* (2013.01); *G05F 1/625* (2013.01); *G06F 1/26* (2013.01); *G06F 1/3296* (2013.01);
(Continued)

(58) Field of Classification Search
USPC .......................................................... 307/31
See application file for complete search history.

(56) References Cited

U.S. PATENT DOCUMENTS

| 4,990,913 A | 2/1991 | Beauducel |
| 7,413,126 B2 | 8/2008 | Pettinelli, Jr. et al. |

(Continued)

FOREIGN PATENT DOCUMENTS

| EP | 0729234 A1 | 8/1996 |
| EP | 0757447 A2 | 2/1997 |
| WO | 2012014202 A1 | 2/2012 |

OTHER PUBLICATIONS

Extended European Search Report from corresponding European Application No. 13886732.0 dated Jan. 30, 2017.
(Continued)

*Primary Examiner* — Rexford N Barnie
*Assistant Examiner* — Dru Parries
(74) *Attorney, Agent, or Firm* — Lando & Anastasi, LLP

(57) ABSTRACT

Systems and methods of measuring dynamic signals for power distribution units. In one embodiment, a power distribution unit (PDU) includes an analog to digital converter (ADC) including a plurality of channels, each channel corresponding to a respective outlet of a plurality of outlets of the PDU. The PDU further includes a microprocessor coupled to the ADC and configured to measure a scale of a signal output from a first channel of the ADC, compare the scale of the signal to a sensitivity threshold, and select, for a first outlet corresponding to the first channel, a reference voltage of a plurality of reference voltages for input to the ADC based on a result of comparing. Various embodiments allow using an ADC to measure low level outlet currents of less than around 300 mA in addition to high level currents such as around 20 A.

20 Claims, 5 Drawing Sheets

(51) Int. Cl.
*G06F 1/26* (2006.01)
*G06F 1/3296* (2019.01)
*G05F 1/625* (2006.01)
*H02J 1/00* (2006.01)
G01R 21/133 (2006.01)
G01R 35/00 (2006.01)

(52) U.S. Cl.
CPC .............. *H02J 1/00* (2013.01); *G01R 21/133* (2013.01); *G01R 35/005* (2013.01); *Y02D 10/172* (2018.01)

(56) References Cited

U.S. PATENT DOCUMENTS

| 7,514,814 | B2 | 4/2009 | Menas et al. |
| 8,305,007 | B2 | 11/2012 | Zhao |
| 2003/0048255 | A1 | 3/2003 | Choi et al. |
| 2008/0160937 | A1 | 7/2008 | Baker et al. |
| 2009/0234512 | A1 | 9/2009 | Ewing et al. |
| 2010/0328849 | A1 | 12/2010 | Ewing et al. |
| 2011/0012519 | A1 | 1/2011 | Zhao |

OTHER PUBLICATIONS

Notification of Transmittal of the International Search Report and the Written Opinion of the International Searching Authority from corresponding PCT/US2013/045380 dated Dec. 23, 2013.

DYNAMIC SENSITIVITY ADJUSTMENT FOR ADC MEASUREMENTS

CROSS-REFERENCE TO RELATED APPLICATIONS

This application is a U.S. National Stage Application under 35 U.S.C. § 371 of International Application No. PCT/US2013/045380, filed Jun. 12, 2013, titled DYNAMIC SENSITIVITY ADJUSTMENT FOR ADC MEASUREMENTS, which is hereby incorporated herein by reference in its entirety.

BACKGROUND

1. Field of the Disclosure

Embodiments of the present disclosure relate generally to analog to digital conversion. More specifically, embodiments relate to systems and methods for dynamic sensitivity adjustment for analog to digital conversion in power distribution units.

2. Description of Background

Datacenters often include multiple power distribution units (PDUs) contained within equipment racks. Rack-mounted power distribution units, sometimes referred to as rack PDUs, typically provide power to various devices such as servers and networking components contained within the equipment racks. It is often desirable to measure current or voltage used by various devices coupled to outlets of a PDU or a rack PDU. More particularly, there is a need for accurate measurement of both small and large signals using analog to digital converters (ADCs). A typical approach to measuring small and large signals involves using separate ADCs. Each ADC may be optimized to handle measurement of small, low level signals or large, high level signals, but typically not both. The use of multiple ADCs adds cost and complexity to the sampling circuit. Another approach requires using signal conditioning circuitry that amplifies the signal applied to the ADC. However, this approach requires one or more amplifiers to accommodate each input channel to the ADC and affects the signal being measured as variations in amplifier gain must be accounted for, thereby also increasing both complexity and cost.

SUMMARY

At least some aspects and embodiments are directed to providing dynamic ADC measurement sensitivity adjustment for PDUs having one or more outlets. Various embodiments may include an ADC configured to allow accurate measurement of both high and low levels of outlet currents. This may be achieved by providing a plurality of ADC reference voltages to measure both high outlet currents and low outlet currents. Using a large ADC voltage reference will allow measurement of high outlet current without clipping of ADC measurements. Using a small ADC voltage reference will allow measurement of low outlet currents by effectively increasing the resolution of the signal measurement at lower levels. This also increases the signal to noise ratio when measuring lower current levels. Various embodiments may not require additional signal conditioning circuitry to affect the signal being measured.

According to one aspect, there is provided a method of measuring dynamic signals using an analog to digital converter (ADC) in a power distribution unit (PDU). The method comprises acts of associating a plurality of outlets of the PDU with a plurality of channels of the ADC, providing a plurality of reference voltages, measuring a scale of a signal output from a first channel of the ADC, comparing the scale of the signal to a sensitivity threshold, and selecting, for a first outlet corresponding to the first channel, a reference voltage of the plurality of reference voltages for input to the ADC based on a result of the comparing. In some embodiments, the signal may correspond to a value of current through the first outlet.

In some embodiments, the method may further comprise, after selecting a reference voltage, determining a measured value from the signal output from the first channel and applying a calibration value to the measured value based on the reference voltage.

In some embodiments, the method may further comprise providing a plurality of sensitivity thresholds, each sensitivity threshold corresponding to a respective reference voltage of the plurality of reference voltages. The sensitivity threshold may be based on a current reference voltage of the plurality of reference voltages. In some embodiments, the method may further comprise measuring the scale of the signal output from the first channel of the ADC based on the current reference voltage. In some embodiments, the sensitivity threshold may include a threshold range and comparing may further include determining whether the scale of the signal is within the threshold range. The method may further comprise switching from using the current reference voltage to a different reference voltage in response to a determination that the scale of the signal is outside the threshold range.

In some embodiments, the method may further comprise switching from using the current reference voltage to a different reference voltage that is lower than the current reference voltage in response to a determination that the scale of the signal is less than or equal to a lower bound of the threshold range. The method may further comprise switching from using the current reference voltage to a different reference voltage that is higher than the current reference voltage in response to a determination that the scale of the signal is greater than or equal to an upper bound of the threshold range.

In some embodiments, the method may further comprise providing a microprocessor coupled to the ADC and using the microprocessor to perform the acts of measuring, comparing and selecting. The method may further comprise calibrating the microprocessor based on the reference voltage and measuring the scale of a second signal output from the first channel of the ADC based on the reference voltage using the calibrated microprocessor.

According to another aspect, a power distribution unit (PDU) comprises an input configured to receive input power from an input power source, a plurality of outlets configured to provide output power, an analog to digital converter (ADC) including a plurality of channels, and a microprocessor coupled to the ADC. The microprocessor may be configured to measure a scale of a signal output from a first channel of the ADC, compare the scale of the signal to a sensitivity threshold, and select, for a first outlet corresponding to the first channel, a reference voltage of a plurality of reference voltages for input to the ADC based on a result of comparing. In some embodiments, the signal may correspond to a value of current through the first outlet.

In some embodiments, the microprocessor may be further configured to measure the scale of the signal based on a current reference voltage of the plurality of reference voltages. The sensitivity threshold may be based on the current reference voltage. In some embodiments, the sensitivity threshold may include a threshold range and the microprocessor may be further configured to determine whether the scale of the signal is within the threshold range, and switch from the current reference voltage to a different reference voltage in response to a determination that the scale of the signal is outside the threshold range. In some embodiments, the different reference voltage may be lower than the current reference voltage in response to a determination that the scale of the signal is less than or equal to a lower bound of the threshold range. The different reference voltage may be higher than the current reference voltage in response to a determination that the scale of the signal is greater than or equal to an upper bound of the threshold range.

In some embodiments, the PDU may further comprise a reference voltage switch configured to receive the plurality of reference voltages and a control signal indicative of the selected reference voltage and to provide the selected reference voltage to the ADC. In some embodiments, the PDU may further comprise a memory configured to store a plurality of sets of calibration values. Each set of calibration values may correspond to a respective reference voltage of the plurality of reference voltages and the microprocessor may be further configured to receive a set of calibration values corresponding to the selected reference voltage.

According to another aspect, a power distribution unit (PDU) comprises an input configured to receive input power from an input power source, a plurality of outlets configured to provide output power, and an analog to digital converter (ADC) including a plurality of channels. The PDU further comprises means for measuring, for each outlet of the plurality of outlets, a value output by a respective channel of the ADC and corresponding to a value of current through the outlet and for selecting a reference voltage of the ADC based on the value measured.

In some embodiments, the means for measuring may be configured to switch from a current reference voltage to the selected reference voltage in response to a determination that the value measured is outside a threshold range of the current reference voltage. In some embodiments, the selected reference voltage may be lower than the current reference voltage in response to a determination that the value measured is less than or equal to a lower bound of the threshold range. In some embodiments, the selected reference voltage may be higher than the current reference voltage in response to a determination that the value measured is greater than or equal to an upper bound of the threshold range.

In some embodiments, the PDU may further comprise means for calibrating the means for measuring based on the reference voltage.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the disclosure. In the figures, each identical or nearly identical component that is illustrated in various figures is represented by a like numeral. For purposes of clarity, not every component may be labeled in every figure. In the figures.

DETAILED DESCRIPTION

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiment.

Also, the phraseology and terminology used herein is for the purpose of description and should not be regarded as limiting. Any references to embodiments or elements or acts of the systems and methods herein referred to in the singular may also embrace embodiments including a plurality of these elements, and any references in plural to any embodiment or element or act herein may also embrace embodiments including only a single element. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

When designing an ADC circuit, it is difficult to offer a system that is able to measure large signals while also being able to measure very small signals with a high level of precision. When an ADC circuit having an output of n bits is designed, it is typically designed to tolerate the largest magnitude signal that would be applied to it. When this largest magnitude signal is applied to the ADC, the output would be at or near the full n bits that describe the signal. When a small signal is applied to the same ADC circuit, the output would be n-x bits which describe the small signal with less detail.

While multiple distinct ADCs, each optimized for a respective signal scale may be used, it is desirable to minimize the number of components used to accomplish a function, to reduce cost and conserve circuit board space. Accordingly, various embodiments disclosed herein include an ADC having dynamic sensitivity to handle dynamic signals of various scales, while keeping components, board space, complexity and cost to a minimum.

Figure 1:
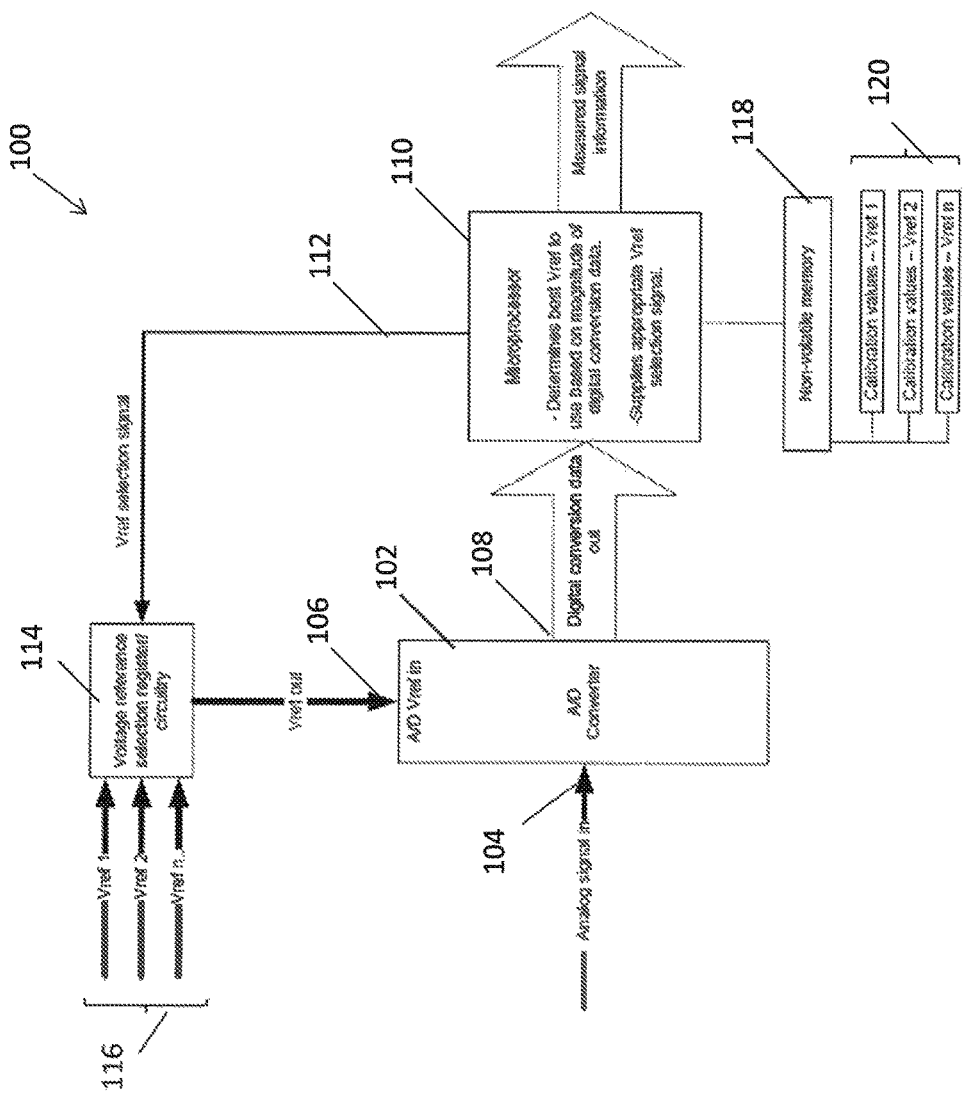
FIG. 1 illustrates one embodiment of a system for dynamic sensitivity adjustment for ADC measurements according to aspects of the present disclosure.

FIG. 1 shows one embodiment of a system 100 for measuring dynamic signals. The system 100 includes an ADC 102 having a first input 104 configured to receive an analog signal and a second input 106 configured to receive a reference voltage. The ADC 102 has an output 108 configured to provide a digital signal corresponding to the analog signal at input 104 based on the reference voltage provided at the second input 106.

The system 100 further includes a microprocessor 110 coupled to the ADC 102 and configured to receive the signal output from the ADC. The microprocessor 110 may be configured to measure the signal output from the ADC. The microprocessor 110 may further be configured to measure the scale of the signal output from the ADC and to compare the scale of the signal to a sensitivity threshold. In various embodiments, the sensitivity threshold may be a threshold range. The microprocessor 110 may further be configured to select a reference voltage from a plurality of reference voltages based on a result of the comparison. In system 100, the microprocessor 110 is shown to provide a control signal 112 indicative of the selected reference voltage to a reference voltage switch 114. The reference voltage switch 114 is configured to receive a plurality of reference voltages 116 (Vref 1, Vref 2, . . . , Vref n) and to provide the selected reference voltage to the ADC 102 based on the control signal 112.

The system 100 further includes a non-volatile memory 118 configured to store a plurality of sets of calibration values 120. Each set of calibration values may correspond to a respective reference voltage of the plurality of reference voltages 116. In some embodiments, the microprocessor 110 may be calibrated using a set of calibration values corresponding to the selected reference voltage input to the ADC 102 at input 106.

The system 100 allows measurement of dynamic signals, ranging in scale from small to large magnitudes, without requiring additional signal conditioning circuitry or separate ADCs for each signal scale. By changing the voltage reference between one of two or more predetermined and calibrated states, such as the plurality of reference voltages 116, it is possible to sample small signals with higher resolution, as well as to sample larger signals based on the output of the same ADC. In one embodiment, selection of the appropriate reference voltage to apply to the ADC may be accomplished using simple switching circuitry.

Additionally, in system 100, by using the microprocessor 110 that would be used to evaluate the output of the ADC 102, the control signal 112 may be generated by the microprocessor to select the appropriate reference voltage applied to the ADC without any additional comparison or feedback circuitry required to affect the reference voltage selection. Thus, various embodiments of the present disclosure do not require a separate microprocessor or data processor to facilitate the data collection and analysis as well as reference voltage selection. In some embodiments, data collection, data processing and reference voltage selection may be performed by a single microprocessor, such as the microprocessor 110 of the system 100.

Various embodiments may not require a digital to analog converter (DAC) to generate reference voltages. In various embodiments, pre-defined or predetermined reference voltages may be generated by semiconductor band gap devices, power supply output voltages, resistive dividers or other method that would allow precise derivation of reference voltages. A reference voltage may be selected or applied to the ADC based on control signals provided by the microprocessor to semiconductor or other type switches. For example, the reference voltage switch 114 of the system 100 may include a semiconductor switch. The switch may include a transistor switch.

In various embodiments, two or more voltage references to be applied to the ADC may be provided, in contrast to a typical ADC system which would have a single fixed reference voltage across which all applied signals would be compared. Embodiments may provide various systems and methods for selecting the individual voltage references for application to the ADC.

In some embodiments, separate switching circuitry, as shown for example in FIG. 1, may be configured to allow selection of a reference voltage from two or more reference voltages by application of a control signal applied to the switching circuitry. The reference voltage switch 114 in FIG. 1 may include one or more switching circuits. In one example, each switching circuit may include one or more transistor switches.

In one example, the ADC 102 in FIG. 1 is a 10 bit ADC, which corresponds to 1024 steps or counts 0 to 1023. A first reference voltage, Vref 1, is 5V, which corresponds to about 4.9 mV/step for the 10 bit ADC. Thus, the smallest measurable signal based on the first reference voltage is about 5 mV. A second reference voltage, Vref 2, is 1V, which corresponds to about 0.98 mV/step for the 10 bit ADC. Thus, the smallest measurable signal based on the second reference voltage is about 1 mV.

Output of the 10-bit ADC 102 read by the microprocessor 110 depends on the reference voltage as shown in Tables I and II below. Table I shows the output of the ADC corresponding to the signal applied at the input of the ADC using the 5V reference voltage. Table II shows the output of the ADC corresponding to the signal applied at the input of the ADC using the 1V reference voltage.

As can be seen in Table I, an input signal of 1-5 mV applied to the ADC cannot be accurately measured based on the resulting output when using the 5V reference voltage. However, input signals up to 5V may be measured based on the 5V reference voltage. As can be seen in Table II, using the 1V reference voltage allows for unique outputs when input signals of 1-5 mV are applied to the ADC. However signals above 1V cannot be measured based on the 1V reference voltage.

TABLE I

| reference voltage = 5 V | |
|---|---|
| Signal applied at the ADC input | Output of ADC |
| 5 V | 1023 counts |
| 2.5 V | 512 counts |
| 1 V | 205 counts |
| 0.5 V | 103 counts |
| 5 mV | 0-1 counts |
| 4 mV | 0-1 counts |
| 3 mV | 0-1 counts |
| 2 mV | 0-1 counts |
| 1 mV | 0-1 counts |

TABLE II

| reference voltage = 1 V | |
| --- | --- |
| Signal applied at the ADC input | Output of ADC |
| 5 V | 1023 counts |
| 2.5 V | 1023 counts |
| 1 V | 1023 counts |
| 0.5 V | 512 counts |
| 5 mV | 5 counts |
| 4 mV | 4 counts |
| 3 mV | 3 counts |
| 2 mV | 2 counts |
| 1 mV | 1 count |

In some embodiments, the microprocessor 110 may be configured to select the appropriate reference voltage to use based on the output read from the ADC. For example, the microprocessor firmware may be configured to select the reference voltage. The microprocessor may be configured to measure the scale of a signal output from the ADC. This measurement may be based on a currently used reference voltage. For example, if the current reference voltage is 5V, the output of the ADC may be as shown in Table I and if the current reference voltage is 1V, the output of the ADC may be as shown in Table II.

The microprocessor 110 may further be configured to compare the output signal or the scale of the output signal to a sensitivity threshold and select the reference voltage based on the comparison. The sensitivity threshold may be a threshold range. Each reference voltage of a plurality of reference voltages may have a corresponding sensitivity threshold range. For example, the 5V reference voltage may have a threshold range [205, 1023] having a lower bound of 205 counts and an upper bound of 1023 counts. The 1V reference voltage may have a threshold range [0, 1023], with a lower bound of zero and an upper bound non-inclusive of 1023.

In some embodiments, the microprocessor may be configured to compare the ADC output to the sensitivity threshold corresponding to the current voltage reference. More specifically, the microprocessor may be configured to determine whether the ADC output is outside the sensitivity threshold range. For example, if the current reference voltage is 5V, the microprocessor may be configured to compare the ADC output to the [205, 1023] threshold range corresponding to the 5V reference voltage. The microprocessor may further be configured to select a next reference voltage for application to the ADC based on a result of the comparison. For example, if the microprocessor determines that the ADC output is below 205 counts, which is below the lower bound of the [205, 1023] range, the microprocessor may select the lower 1V reference voltage and generate a control signal to switch the reference voltage from 5V to 1V.

Furthermore, if the current reference voltage is 1V, the microprocessor may be configured to compare the ADC output to the [0, 1023] threshold range corresponding to the 1V reference voltage. If the microprocessor determines that the ADC output reached 1023 counts, which is greater than the upper bound of the [0, 1023] range, the microprocessor may select the higher reference voltage of 5V and generate a control signal to switch the reference voltage from 1V to 5V.

In various embodiments, the microprocessor may be configured to determine whether the scale of the signal output from the ADC is within or outside the threshold range corresponding to the current reference voltage used to read the output. The microprocessor may be configured to switch from the current reference voltage to a different reference voltage based on a determination that the scale of the signal is outside the threshold range. More specifically, as described in the examples above, the microprocessor may be configured to switch to a different reference voltage that is lower than the current reference voltage in response to a determination that the scale of the signal is less than (or in some embodiments equal to) a lower bound of the threshold range corresponding to the current reference voltage. The microprocessor may also be configured to switch to a different reference voltage that is higher than the current reference voltage in response to a determination that the scale of the signal is greater than (or in some embodiments equal to) an upper bound of the threshold range corresponding to the current reference voltage. The newly selected reference voltage applied to the ADC may then be used for one or more subsequent measurements. In some embodiments, the microprocessor may be configured to maintain the same reference voltage or to switch to a new reference voltage following each measurement.

In some embodiments, the system 100 may be configured to calibrate the microprocessor 110 based on the selected reference voltage. A signal output from the ADC may then be measured by the calibrated microprocessor. In some embodiments, the microprocessor 110 may be configured to select appropriate calibration values depending on the selected reference voltage. The microprocessor 110 may be configured to calibrate a signal output from the ADC using calibration values corresponding to the selected reference voltage. This allows for accurate reporting of the physical measurement being made relative to the ADC reading. In one example, the measured signal information from the microprocessor 110 is an 8 bit byte with a value of 0-50 that represents the voltage applied to the ADC with a resolution of 0.1V. This output value may be derived from comparing the ADC resulting output to a calibration value.

As shown in FIG. 1, non-volatile memory 118 stores a plurality of calibration values or parameters, such as zero, scale factor and range of calibration. Calibrating may include applying a known signal level, reading the ADC output and associating the resulting ADC output with the known signal level. For a linear system, this allows for interpolation and extrapolation of measurements below and beyond the known calibration signal, corresponding to a range of calibration. In one example, the non-volatile memory 118 is an electrically erasable programmable read-only memory (EEPROM). Each set of calibration values or parameters may correspond to a respective reference voltage of the plurality of reference voltages 116 supported by the system 100. In response to selecting a new reference voltage, the microprocessor 110 may be configured to obtain calibration values corresponding to the new reference voltage and to apply the calibration values to signals output from the ADC 102, for example after the reference voltage switch 114 provides the new reference voltage to the ADC.

Usage of a plurality of reference voltages allows measurement of both large and small signals applied to an ADC. A higher reference voltage gives the ADC bandwidth to measure large signals while a lower reference voltage gives the ADC the sensitivity required to measure small signals with high resolution. Using a microprocessor coupled to the ADC to read the ADC output conversions to determine the appropriate reference voltage to use eliminates the need for additional feedback or amplification circuitry. Some embodiments may include a switch configured to receive a control signal to switch between reference voltages. In some embodiments the switch may be separate from the microprocessor and the ADC as shown for example by the reference voltage switch 114 in FIG. 1. In other embodiments, the switch may be included in the microprocessor or the ADC. In some embodiments, an ADC may have a single input for receiving a reference voltage. In other embodiments, an ADC may have multiple inputs for receiving multiple reference voltages and may further be configured to switch reference voltages. In various embodiments, the ADC may be any type of ADC, such as a Sigma-Delta ADC or a successive approximation ADC.

Various embodiments of measurement systems disclosed herein may be configured to couple to a PDU or may be included in a PDU, for example as shown and described below with reference to FIG. 3. For example, the system 100 in FIG. 1 may be included in a PDU having one or more electrical outlets. The system 100 may be configured to measure outlet currents. The ADC 102 may have one or more input and output channels, each being associated with a respective outlet of the PDU. Systems and methods disclosed herein provide the ability to switch between two or more ADC reference voltages on a per outlet basis. Each outlet may have a respective reference voltage selected depending on the required sensitivity of current measurement. Furthermore, calibration values such as bias and scale factors may be selected per outlet depending on the selected reference voltage or current measurement sensitivity required for that outlet.

As described above, in various embodiments the microprocessor firmware may be calibrated to correctly interpret the ADC output based on the known ADC reference voltage selected to read a signal. In some embodiments, the calibration may be performed on a per outlet basis. In some embodiments, separate calibration values may correspond to separate reference voltages. For example, each reference voltage or sensitivity mode may have a respective no load bias point, a respective current calibration scale factor and a respective power calibration scale factor. Thus, a respective bias point, calibration scale factor and power calibration scale factor may be applied to a respective outlet depending on the reference voltage selected or applied to that outlet.

In some embodiments, a set of calibration values may correspond to a respective reference voltage and at least one outlet. Each outlet of a plurality of outlets may have a corresponding plurality of sets of calibration values, each set of calibration values corresponding to a respective reference voltage that may be applied to that outlet.

In one example, a normal or default reference voltage is 5V, and a high sensitivity reference voltage is 1V. A first bias point per outlet is provided for the normal 5V reference voltage, and a second bias point per outlet is provided for the high sensitivity reference voltage of 1V. A first current calibration scale factor per outlet is provided for the normal 5V reference voltage and a second calibration scale factor per outlet is provided for the high sensitivity reference voltage of 1V. A first power calibration scale factor per outlet is provided for the normal 5V reference voltage and a second power calibration scale factor per outlet is provided for the high sensitivity reference voltage of 1V. These calibration values such as bias and scale factors are stored in a memory such as EEPROM. The microprocessor firmware is configured to provide functions for bias, current scale and power scale auto calibration for both normal and high sensitivity modes of operation.

Some embodiments may allow application of a single reference voltage to an ADC. Other embodiments may allow application of multiple selected reference voltages to an ADC. For example, a microprocessor or microcontroller may be configured to allow two or more reference voltages to be applied to a single ADC. Some embodiments may include a firmware register that allows for selection of the reference voltage to be used.

Figure 2:
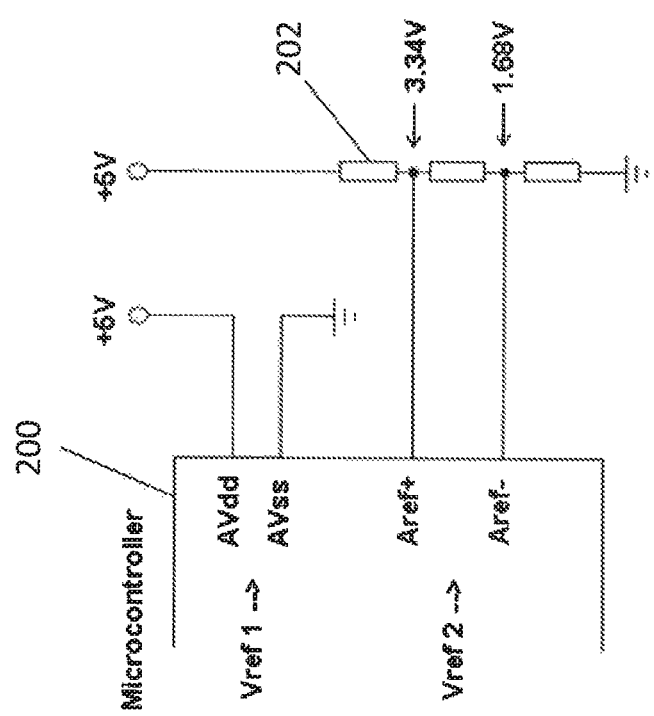
FIG. 2 illustrates another embodiment of a system for dynamic sensitivity adjustment for ADC measurements according to aspects of the present disclosure.

FIG. 2 shows one embodiment of a microcontroller 200 configured to switch between a primary reference voltage Vref 1 and a secondary reference voltage Vref 2 for dynamic sensitivity adjustment for ADC measurements. In one example, switching between the reference voltages is accomplished with a register such as a reference control register. As shown in FIG. 2, the reference voltage may be switched between a 5V/ground reference and separate references on Aref+/− pins to provide high and low sensitivity modes for measuring dynamic signals. In one example, the microcontroller 200 is configured to switch from a 5V reference voltage to the Aref+/− pins for the reference voltage. For a 10-bit ADC, the sensitivity thus switches from approximately 4.88 mV/count to approximately 1.56 mV/count, which may further reduce low level noise.

The schematic example in FIG. 2 uses a resistive divider 202 to center the secondary voltage reference around approximately 2.5V. Basing the secondary reference voltage off Vdd/Vref 1 allows the secondary reference voltage Vref 2 to scale with any fluctuations in the primary voltage supply.

Figure 3:
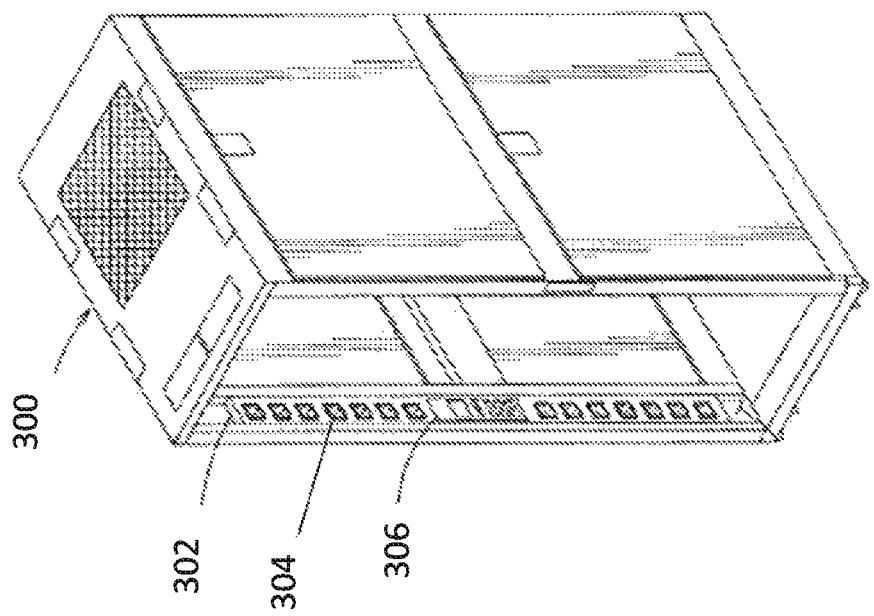
FIG. 3 illustrates a rack PDU including a system for dynamic sensitivity adjustment for ADC measurements according to aspects of the present disclosure.

FIG. 3 illustrates a rack 300 configured to house one or more equipment such as data center equipment. The rack 300 houses a rack PDU 302 including a plurality of electrical outlets 304. The rack PDU 302 may be configured according to one or more aspects disclosed herein. The rack PDU 302 may include a measurement system 306, for example for measuring currents for one or more outlets 304. For example, the rack PDU 302 may include the system 100 of FIG. 1 or the microprocessor of FIG. 2. The ADC 102 in the embodiment of FIG. 1 may be included in the measurement system 306 and may have one or more input and output channels, each being associated with a respective outlet 304 of the rack PDU 302. Each outlet 304 may be measured independently and may have a respective reference voltage selected based on a scale of a signal measured at that outlet.

Figure 4:
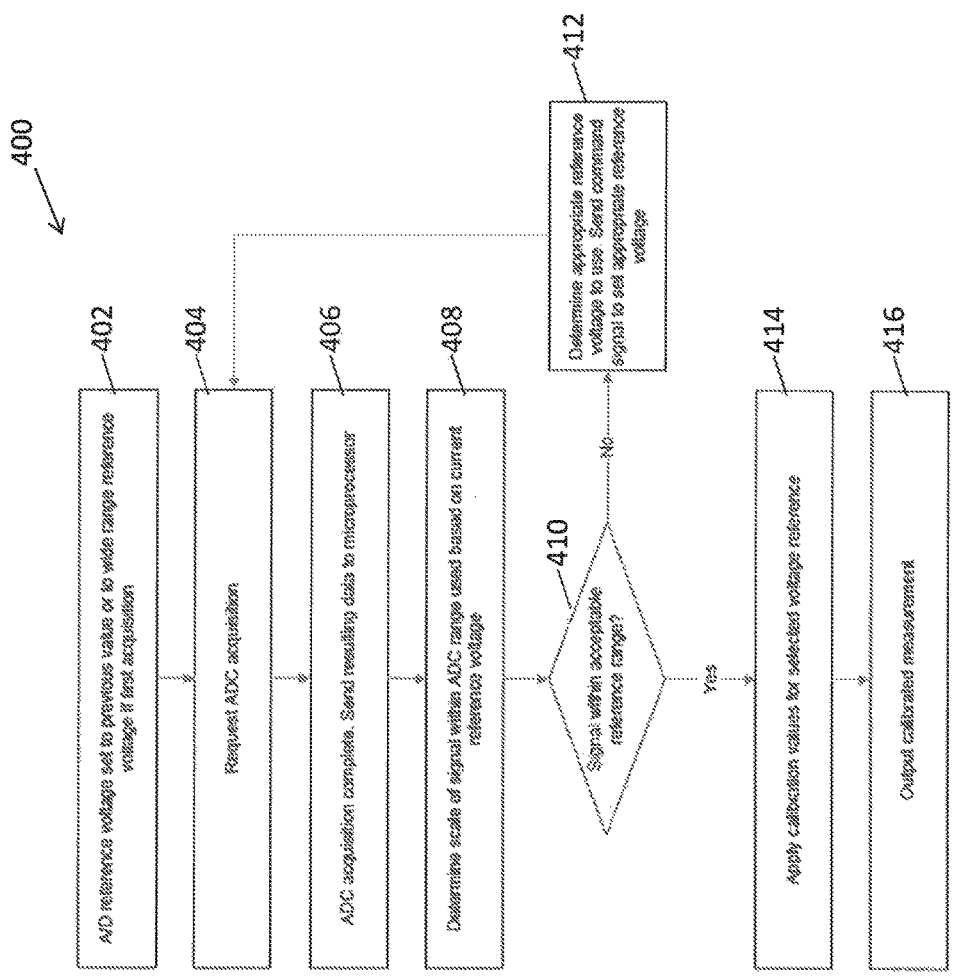
FIG. 4 is a flow diagram of one example of a method of dynamic sensitivity adjustment for ADC measurements according to aspects of the present disclosure.

FIG. 4 shows a flow diagram of one example of a method 400 of measuring dynamic signals using an ADC. The method 400 may be performed for example by the system 100 of FIG. 1. The method 400 includes initially setting the ADC reference voltage to a previous value or to a wide range reference voltage as shown at block 402. For example, the ADC may be the ADC 102 of the embodiment in FIG. 1 and the reference voltage may initially be 5V. The method 400 further includes requesting ADC acquisition at block 404 and providing, at block 406, the output from the ADC to a microprocessor, such as the microprocessor 110 of FIG. 1.

The method 400 further includes measuring the scale of the signal output from the ADC and comparing the scale of the signal to a threshold range corresponding to the current reference voltage applied to the ADC, as shown at block 408. The current reference voltage may be the initial reference voltage for a first acquisition. The act of block 408 may be performed by a microprocessor as shown and described above with reference to FIG. 1.

The method 400 further includes determining at block 410 whether the signal is within or outside the sensitivity threshold range corresponding to the current reference voltage. If the signal is not within the threshold range of the current reference voltage, the method 400 proceeds to block 412, which includes determining or selecting a new reference voltage and providing a control signal to set the selected reference voltage. The acts at block 412 may be performed for example by a microprocessor. In one embodiment, the control signal may be provided by the microprocessor to a reference voltage switch configured to apply the selected reference voltage to the ADC. In another embodiment, the control signal may be applied by the microprocessor to the ADC. Following application of the selected reference voltage to the ADC, the acts at blocks 404 to 410 may be repeated.

At block 410, in response to determining that the signal is within the threshold range of the current reference voltage, the method 400 may proceed to block 414. The method 400 includes applying calibration values corresponding to the selected reference voltage at block 414 and outputting a calibrated measurement at block 416. Calibration values may be retrieved from a non-volatile memory and applied by a microprocessor to an output signal of the ADC to generate a calibrated measurement output by the microprocessor.

In other embodiments, the method 400 may include different acts, additional acts or fewer acts than shown in FIG. 4. For example, in one embodiment, the method may further include an act of determining whether the scale of the signal is less than (or in some embodiments equal to) a lower bound of the range corresponding to the current reference voltage. The method may further include an act of switching from the current reference voltage to a different reference voltage that is less than the current reference voltage in response to determining that the scale of the signal is less than (or equal to) a lower bound of the range corresponding to the current reference voltage. This allows measuring smaller signals with higher resolution.

The method may further include an act of determining whether the scale of the signal is greater than (or in some embodiments equal to) an upper bound of the range corresponding to the current reference voltage. The method may further include an act of switching from the current reference voltage to a different reference voltage that is greater than the current reference voltage in response to determining that the scale of the signal is greater than (or equal to) an upper bound of the range corresponding to the current reference voltage. This allows measuring larger signals.

Various systems and methods according to aspects disclosed herein address the need to accurately measure dynamic signals, for example dynamic alternating current (AC) loads in a PDU. Alternating currents may be coupled to the ADC through a current transformer, Hall Effect sensor or shunt. The resulting signal applied to the ADC may be an AC voltage that is proportional to the current being measured. For example, an AC voltage of 50 mV P-P may be applied to the ADC for every 1 A of current being measured. To accurately measure the AC voltage, many discrete samples from the AC sine wave may be obtained.

A fixed reference voltage may allow accurate measurement of larger values of alternating current (for example around 1 A to around 20 A). However, alternating currents below 0.5 A are challenging to measure with enough ADC resolution to allow for accurate calculation of the alternating current being measured. Aspects of the present disclosure use a dynamic reference voltage to accurately measure small values of alternating current such as alternating currents below around 1 A, 0.5 A and 0.3 A while still being capable of measuring larger amounts of alternating current such as greater than around 1 A.

Table III shows one example of a data set obtained for readings of alternating current through a Hall Effect sensor coupled to an ADC input at around 40 mV/A. In this example, a reference voltage of 1.66V is used. In addition to the 1.66V reference voltage, the measurement system of this example also includes a nominal 5V reference voltage which may be applied to the ADC. However, the 5V reference voltage may not be used to read below around 0.5 A. Table III illustrates that in one example, using the secondary reference voltage of 1.66V applied to the ADC according to aspects disclosed herein allows reading alternating currents down to around 50 mA.

TABLE III

| reference voltage = 1.66 V | | |
| --- | --- | --- |
| Parameter | Current (A RMS) | Output |
| No load current | 0 | 3 counts |
| Load current | 0.05 | 4-5 counts |
| Load current | 0.1 | 11 counts |
| Load current | 0.2 | 20 counts |
| Load current | 0.3 | 31 counts |
| Load current | 0.4 | 41 counts |
| Load current | 0.5 | 51 counts |
| Load current | 1 | 103 counts |
| Bias point | 0 | 520 counts |

One or more features disclosed herein may be implemented in one or more PDUs or rack PDUs. In other embodiments, various aspects and functions described herein may be implemented in one or more apparatuses separate from a PDU or a rack PDU. An apparatus configured according to one or more features disclosed herein may be configured to couple to a PDU or a rack PDU to allow measurement of dynamic signals.

Furthermore, various aspects and functions described herein in accord with the present disclosure may be implemented as hardware, software, firmware or any combination thereof. Aspects in accord with the present disclosure may be implemented within methods, acts, systems, system elements and components using a variety of hardware, software or firmware configurations. Furthermore, aspects in accord with the present disclosure may be implemented as specially-programmed hardware and/or software.

Figure 5:
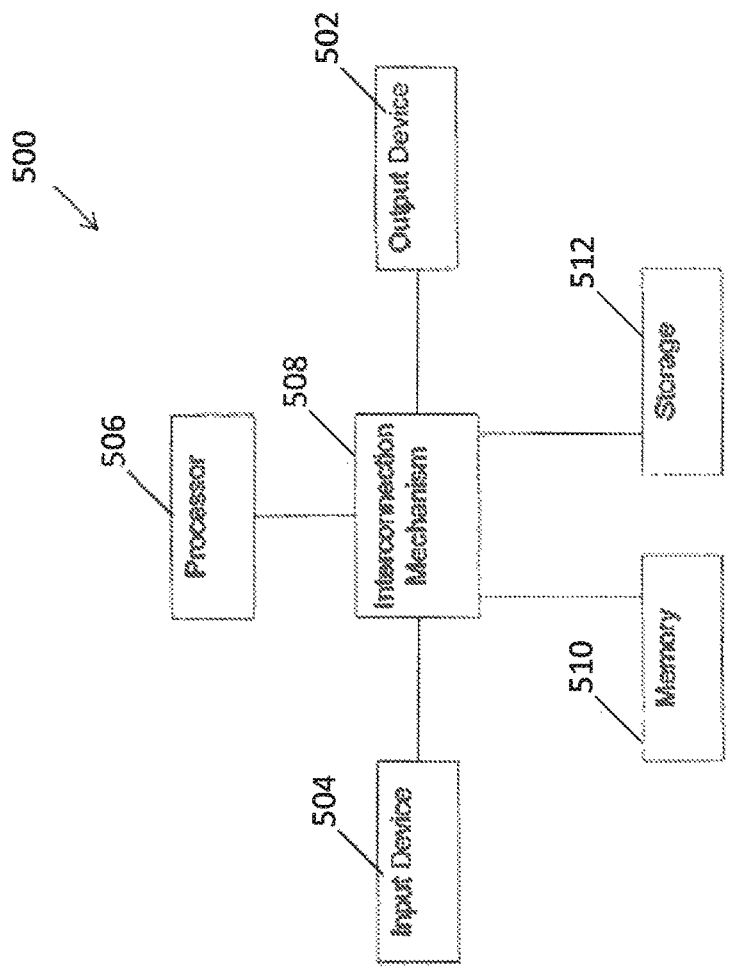
FIG. 5 is a block diagram of one example of a computer system upon which various aspects of the present embodiments may be implemented.

Referring to FIG. 5, there is illustrated a block diagram of one example of computing components forming a system 500 which may be configured to implement one or more aspects disclosed herein. For example, the system 500 may be configured to implement the measurement system 100 as illustrated and described above with reference to FIG. 1.

The system 500 may include for example a general-purpose computing platform such as those based on Intel PENTIUM-type processor, Motorola PowerPC, Sun Ultra-SPARC, Hewlett-Packard PA-RISC processors, or any other type of processor. System 500 may include specially-programmed, special-purpose hardware, for example, an application-specific integrated circuit (ASIC). Various aspects of the present disclosure may be implemented as specialized software executing on the system 500 such as that shown in FIG. 5.

The system 500 may include a processor/ASIC 506 connected to one or more memory devices 510, such as a disk drive, memory, flash memory or other device for storing data. Memory 510 may be used for storing programs and data during operation of the system 500. Components of the computer system 500 may be coupled by an interconnection mechanism 508, which may include one or more buses (e.g., between components that are integrated within a same machine) and/or a network (e.g., between components that reside on separate machines). The interconnection mechanism 508 enables communications (e.g., data, instructions)

to be exchanged between components of the system 500. Further, in some embodiments the interconnection mechanism 508 may be disconnected during servicing of a PDU.

The system 500 also includes one or more input devices 504, which may include for example, a keyboard or a touch screen. An input device may be used for example to configure the measurement system or to provide input parameters. The system 500 includes one or more output devices 502, which may include for example a display. In addition, the computer system 500 may contain one or more interfaces (not shown) that may connect the computer system 500 to a communication network, in addition or as an alternative to the interconnection mechanism 508.

The system 500 may include a storage system 512, which may include a computer readable and/or writeable nonvolatile medium in which signals may be stored to provide a program to be executed by the processor or to provide information stored on or in the medium to be processed by the program. The medium may, for example, be a disk or flash memory and in some examples may include RAM or other non-volatile memory such as EEPROM. In some embodiments, the processor may cause data to be read from the nonvolatile medium into another memory 510 that allows for faster access to the information by the processor/ASIC than does the medium. This memory 510 may be a volatile, random access memory such as a dynamic random access memory (DRAM) or static memory (SRAM). It may be located in storage system 512 or in memory system 510. The processor 506 may manipulate the data within the integrated circuit memory 510 and then copy the data to the storage 512 after processing is completed. A variety of mechanisms are known for managing data movement between storage 512 and the integrated circuit memory element 510, and the disclosure is not limited thereto. The disclosure is not limited to a particular memory system 510 or a storage system 512.

The system 500 may include a general-purpose computer platform that is programmable using a high-level computer programming language. The system 500 may be also implemented using specially programmed, special purpose hardware, e.g. an ASIC. The system 500 may include a processor 506, which may be a commercially available processor such as the well-known Pentium class processor available from the Intel Corporation. Many other processors are available. The processor 506 may execute an operating system which may be, for example, a Windows operating system available from the Microsoft Corporation, MAC OS System X available from Apple Computer, the Solaris Operating System available from Sun Microsystems, or UNIX and/or LINUX available from various sources. Many other operating systems may be used.

The processor and operating system together may form a computer platform for which application programs in high-level programming languages may be written. It should be understood that the disclosure is not limited to a particular computer system platform, processor, operating system, or network. Also, it should be apparent to those skilled in the art that the present disclosure is not limited to a specific programming language or computer system. Further, it should be appreciated that other appropriate programming languages and other appropriate computer systems could also be used.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the disclosure. Accordingly, the foregoing description and drawings are by way of example only, and the scope of the disclosure should be determined from proper construction of the appended claims, and their equivalents.

What is claimed is:

1. A method of measuring dynamic signals using an analog to digital converter (ADC) in a power distribution unit (PDU), the method comprising acts of:
   associating a plurality of outlets of the PDU with a plurality of channels of the ADC;
   providing a plurality of reference voltages;
   measuring a scale of a signal output from a first channel of the ADC;
   comparing the scale of the signal to a sensitivity threshold; and
   selecting, for a first outlet corresponding to the first channel, a reference voltage of the plurality of reference voltages for input to the ADC based on a result of the comparing.

2. The method of claim 1, further comprising after selecting a reference voltage, determining a measured value from the signal output from the first channel and applying a calibration value to the measured value based on the reference voltage.

3. The method of claim 1, further comprising providing a plurality of sensitivity thresholds, each sensitivity threshold corresponding to a respective reference voltage of the plurality of reference voltages.

4. The method of claim 1, wherein the sensitivity threshold is based on a current reference voltage of the plurality of reference voltages.

5. The method of claim 4, further comprising measuring the scale of the signal output from the first channel of the ADC based on the current reference voltage.

6. The method of claim 5, wherein the sensitivity threshold includes a threshold range and comparing further includes determining whether the scale of the signal is within the threshold range, the method further comprising switching from using the current reference voltage to a different reference voltage in response to a determination that the scale of the signal is outside the threshold range.

7. The method of claim 6, further comprising:
   switching from using the current reference voltage to a different reference voltage that is lower than the current reference voltage in response to a determination that the scale of the signal is less than or equal to a lower bound of the threshold range; and
   switching from using the current reference voltage to a different reference voltage that is higher than the current reference voltage in response to a determination that the scale of the signal is greater than or equal to an upper bound of the threshold range.

8. The method of claim 1, wherein the signal corresponds to a value of current through the first outlet.

9. The method of claim 1, further comprising providing a microprocessor coupled to the ADC and using the microprocessor to perform the acts of measuring, comparing and selecting.

10. The method of claim 9, further comprising calibrating the microprocessor based on the reference voltage and measuring the scale of a second signal output from the first channel of the ADC based on the reference voltage using the calibrated microprocessor.

11. A power distribution unit (PDU) comprising:
   an input configured to receive input power from an input power source;

a plurality of outlets configured to provide output power from the input power;
an analog to digital converter (ADC) including a plurality of channels;
a microprocessor coupled to the ADC and configured to:
  measure a scale of a signal output from a first channel of the ADC,
  compare the scale of the signal to a sensitivity threshold, and
  select, for a first outlet corresponding to the first channel, a reference voltage of a plurality of reference voltages for input to the ADC based on a result of comparing.

12. The PDU of claim 11, wherein the microprocessor is further configured to measure the scale of the signal based on a current reference voltage of the plurality of reference voltages and the sensitivity threshold is based on the current reference voltage.

13. The PDU of claim 12, wherein the sensitivity threshold includes a threshold range and the microprocessor is further configured to:
  determine whether the scale of the signal is within the threshold range, and
  switch from the current reference voltage to a different reference voltage in response to a determination that the scale of the signal is outside the threshold range.

14. The PDU of claim 13, wherein the different reference voltage is lower than the current reference voltage in response to a determination that the scale of the signal is less than or equal to a lower bound of the threshold range, and the different reference voltage is higher than the current reference voltage in response to a determination that the scale of the signal is greater than or equal to an upper bound of the threshold range.

15. The PDU of claim 11, further comprising:
  a reference voltage switch configured to receive the plurality of reference voltages and a control signal indicative of the selected reference voltage and to provide the selected reference voltage to the ADC; and
  a memory configured to store a plurality of sets of calibration values, each set of calibration values corresponding to a respective reference voltage of the plurality of reference voltages;
  wherein the microprocessor is further configured to receive a set of calibration values corresponding to the selected reference voltage.

16. The PDU of claim 11, wherein the signal corresponds to a value of current through the first outlet.

17. A power distribution unit (PDU) comprising:
an input configured to receive input power from an input power source;
a plurality of outlets configured to provide output power;
an analog to digital converter (ADC) including a plurality of channels;
means for measuring, for each outlet of the plurality of outlets, a value output by a respective channel of the ADC and corresponding to a value of current through the outlet and for selecting a reference voltage for input to the ADC based on the value measured.

18. The PDU of claim 17, wherein the means for measuring is configured to switch from a current reference voltage to the selected reference voltage in response to a determination that the value measured is outside a threshold range of the current reference voltage.

19. The PDU of claim 18, wherein the selected reference voltage is lower than the current reference voltage in response to a determination that the value measured is less than or equal to a lower bound of the threshold range, and the selected reference voltage is higher than the current reference voltage in response to a determination that the value measured is greater than or equal to an upper bound of the threshold range.

20. The PDU of claim 17, further comprising means for calibrating the means for measuring based on the reference voltage.

* * * * *